United States Patent [19]

Garrett

[11] 4,297,190
[45] Oct. 27, 1981

[54] METHOD FOR REMOVING HEAT FROM A WORKPIECE DURING PROCESSING IN A VACUUM CHAMBER

[75] Inventor: Robert W. Garrett, Reading, Pa.

[73] Assignee: Western Electric Co., Inc., New York, N.Y.

[21] Appl. No.: 211,603

[22] Filed: Dec. 1, 1980

Related U.S. Application Data

[62] Division of Ser. No. 38,741, May 14, 1979.

[51] Int. Cl.³ .............................................. C23C 15/00
[52] U.S. Cl. .................................. 204/192 E; 204/298
[58] Field of Search ............ 204/192 E, 192 EC, 298, 204/192 R; 156/345, 643

[56] References Cited

U.S. PATENT DOCUMENTS

| | | | |
|---|---|---|---|
| 3,399,717 | 9/1968 | Cline | 165/32 |
| 3,463,224 | 8/1969 | Myers | 165/32 |
| 3,529,417 | 9/1970 | Knight | 60/26.1 |
| 3,957,107 | 5/1976 | Altoz et al. | 165/32 |
| 3,977,955 | 8/1976 | Nevis et al. | 204/192 E |
| 4,000,776 | 1/1977 | Kroebig et al. | 165/32 |
| 4,051,890 | 10/1977 | Melchior | 165/32 |
| 4,060,470 | 11/1977 | Clarke | 204/192 R |
| 4,115,184 | 9/1978 | Poulsen | 156/626 |
| 4,130,762 | 12/1978 | Oppel | 250/531 |
| 4,139,051 | 2/1979 | Jones et al. | 165/1 |

*Primary Examiner*—Aaron Weisstuch
*Attorney, Agent, or Firm*—G. W. Houseweart

[57] ABSTRACT

A workpiece (16), for example a magnetic bubble memory wafer, is held in place, and heat is removed from it by an expandable heat pipe (22) during a process performed in a vacuum as, for example, a sputter etch process. The expandable heat pipe (22) includes two plates (24, 26) joined by a bellows (28) to form a sealed chamber containing a vaporizable liquid such as water. During loading of the wafers the heat pipe (22) is compressed by atmospheric pressure and thereby facilitates easy assembly of the wafer (16) and heat pipe (22) into a holding fixture (10) which in turn is bolted to a cooling plate (30) situated inside a vacuum chamber. When the chamber is evacuated, the heat pipe (22) expands to hold the wafer (16) in place and form a good thermal path from the wafer (16) to the cooling plate (30). In an alternate embodiment the heat pipe (22) does not completely fill the gap from the wafer (16) to the cooling plate (30) in a vacuum at room temperature, but rather expands to fill the gap when the heat pipe (22) is heated by the wafer (16). The expanding heat pipe (22) holds the wafer (16) at a constant, predetermined temperature above the temperature of the cold plate.

5 Claims, 2 Drawing Figures

METHOD FOR REMOVING HEAT FROM A WORKPIECE DURING PROCESSING IN A VACUUM CHAMBER

This is a division of application Ser. No. 38,741 filed May 14, 1979.

TECHNICAL FIELD

This invention relates to method and apparatus for removing heat from a workpiece during processing in a vacuum chamber, and, more particularly, to microelectronic device manufacturing fabrication involving ion beam processing of wafers.

BACKGROUND OF THE INVENTION

The present thrust in wafer manufacturing is to shrink line widths and spacing to micron or submicron dimensions. It has therefore become increasingly important to provide precise line dimensions or line stability on wafers. While developments in this area are applicable to a wide range of devices, they are particularly important in the area of magnetic bubble memories. Present magnetic bubble memories typically have over 64,000 bits on a chip of less than ¼ inch on each side. A basic requirement to increasing the density on these chips is to reduce the line widths and spacings and to enhance precision in line width dimensions.

In magnetic bubble memory fabrication the step requiring the most precision in line dimension is the forming of the premalloy pattern. A presently preferred process for forming the permalloy pattern includes nonselectively depositing a continuous layer of permalloy upon a surface of a magnetic bubble memory wafer, which typically includes a gadolinium gallium garnet substrate with layers of silicon dioxide, an aluminum-copper alloy conductor pattern, and another silicon dioxide layer. A positive photoresist pattern is formed on the permalloy layer, leaving exposed those portions of the permalloy to be removed.

The wafer is then placed directly in an ion etching chamber where the photoresist absorbs the ion energy so that all of the permalloy not covered by the photoresist is removed during the etching operation, but the permalloy under the photoresist is left undamaged.

A problem inherent in this technique, involving direct use of photoresist, is that the ion etching operation heats the wafer and raises its temperature to well over 100° C. if no means are used to cool or remove heat from the wafer during the ion etching operation. Since the photoresist deteriorates at temperatures above 100° C., some method must be used to remove the heat from the wafers during the ion etching process.

Several methods have been used in the past to remove heat from the wafers during ion etching operations. One method is to coat the backs of the wafers with vacuum grease or an indium or gallium based amalgam, and then to glue the wafers down to a water cooled base plate. Although effective, this technique is time consuming and introduces contaminants into the chamber during the ion etching operation.

Another method has been to provide a holding plate which contains a plurality of counterbored holes into which the wafer is laid, working side down, while being supported on its outer circumference by the ledge of the hole. The working side of the wafer is exposed through the hole to bombardment by ions coming up from an ion source located in the bottom of the sputtering chamber. A piece of crinkled aluminum foil is placed on top of the wafer to provide uniform heat transfer from the wafer; and then a metal slug is placed on top of the aluminum foil. A clamping or loading spring is placed on top of the metal slug so as to protrude above the top of the holding fixture. Finally, the top of the holding fixture is attached to a water cooled plate which is located inside the sputtering chamber, with the spring claim compressed between the cooling plate and the slug. The heat generated then passes from the wafer through the crinkled aluminum and into the metal slug and then out through the spring clamp. A problem with this method is then the spring clamp is a relatively poor heat conductor and thus a high thermal differential occurs between the metal slug and the cold plate. Thus, the wafer temperature typically is not kept low enough to ensure optimum photoresist characteristics.

A third prior method has been to replace the metal slug and the spring clamp with two parallel plates held apart by a plurality of springs. The adjacent faces of these two metal plates are grooved and spiked so that the two plates intermesh with each other to establish a large surface area between the two plates. These two plates and spring assembly are placed over the crinkled aluminum with the springs compressed, but not to the point that the plates touch each other when the holding fixture is mounted to the cold plate. In this method, some heat is transferred by conduction from the wafer into the lower plate, but the heat transfer from the lower plate to the upper plate is primarily by radiation due to the vacuum environment of the chamber. While the two plates are more efficient than the spring clamp, they are still only marginally satisfactory for this application.

Thus, it can be understood that an efficient heat transfer mechanism for effectively transferring heat from a wafer to a cold plate in the vacuum environment of an RF sputter etching chamber is highly desirable.

SUMMARY OF THE INVENTION

It is therefore an object of this invention to provide a method for cooling a workpiece in a process carried on in a vacuum.

A more specific object of this invention is to provide an efficient heat transfer apparatus for removing heat from a workpiece to a cooling plate in a process carried out in a vacuum chamber.

It is still another object of this invention to provide a method for securing a workpiece in a holding fixture during a sputter etching operation.

It is also an object of this invention to provide a method for holding a workpiece at a predetermined temperature during a manufacturing process.

A more specific object of this invention is to provide a temperature regulation apparatus for holding a workpiece at a predetermined temperature during a process in a vacuum chamber.

To these and other ends, a workpiece holding apparatus for use in a manufacturing operation performed in a vacuum in accordance with this invention includes a holding plate having at least one void disposed therethrough from one surface to another surface, said void having a first portion of a predetermined cross-sectional area for receiving a workpiece and having a second portion of a cross-sectional area less than the first cross-sectional area, for retaining the workpiece. An expandable heat pipe is placed in the first portion of the void in good thermal contact with the workpiece. Advantageously, the heat pipe has a length at ambient pressure such that the combination of the workpiece and the heat pipe is less than the depth of the first portion of the void. Finally, a cold plate is placed in good thermal contact with the surface of the holding plate adjacent to the heat pipe for providing a heat sink to the expandable heat pipe, the expandable heat pipe adopted to expand during the drawing of the vacuum sufficiently to fill the gap between the workpiece and the cold plate.

Also in accordance with this invention is a method for sputter etching a workpiece in a vacuum comprising the steps of exposing a photoresist pattern onto the working surface of the workpiece and removing the photoresist from areas to be milled. The workpiece is placed in a holding plate inside an RF sputtering chamber and a compressed heat pipe is placed in intimate thermal contact with the workpiece. A vacuum is drawn in the chamber to permit the heat pipe to expand and form a low thermal impedance path from the workpiece to a cooling plate inside the chamber. Finally, power is applied to the RF sputtering chamber for bombarding the workpiece with ions for removing the material from the working surface of the workpiece not covered by the photoresist.

An illustrated embodiment of the invention shows an expandable heat pipe for regulating the transfer of heat from a device to a constant temperature mass comprising a first plate and a second plate disposed parallel to each other and connected together by a single bellows to form a hermetic expandable cavity. A vaporizable liquid is inside the cavity for expanding the heat pipe when heated and for transferring heat from the first plate to the second plate.

Also in accordance with this invention is a temperature regulator for maintaining a device at a predetermined temperature. The regulator includes a cold plate and a single bellows expandable heat pipe disposed between the cold plate and the device. The heat pipe is sized and positioned to provide a good thermal contact between the heat pipe and the device, but of insufficient height to form a good thermal conductive path between the cold plate and the device when the device temperature is lower than the predetermined temperature. In this first condition the combination including the heat pipe provides insufficient thermal conductance to remove heat from the device at a rate equal to or faster than that being absorbed by the device. As the temperature of the device increases toward the predetermined temperature, the temperature of the heat pipe also increases, causing the heat pipe to expand and thus to form a better thermal conductive path between the cold plate and the device. The thermal conductance of the heat pipe is adapted such that, in this second condition, the combined thermal conductance is sufficient to remove heat from the device at a faster rate than that being absorbed by the device when the device temperature is greater than the predetermined temperature. As the device temperature decreases, the heat pipe contracts to form a less conductive thermal path between the cold plate and the device.

BRIEF DESCRIPTION OF THE DRAWING

The aforementioned and other features, characteristics, advantages, and the invention in general, will be better understood from the following more detailed description taken in conjunction with the accompanying drawing in which.

Figure 1:
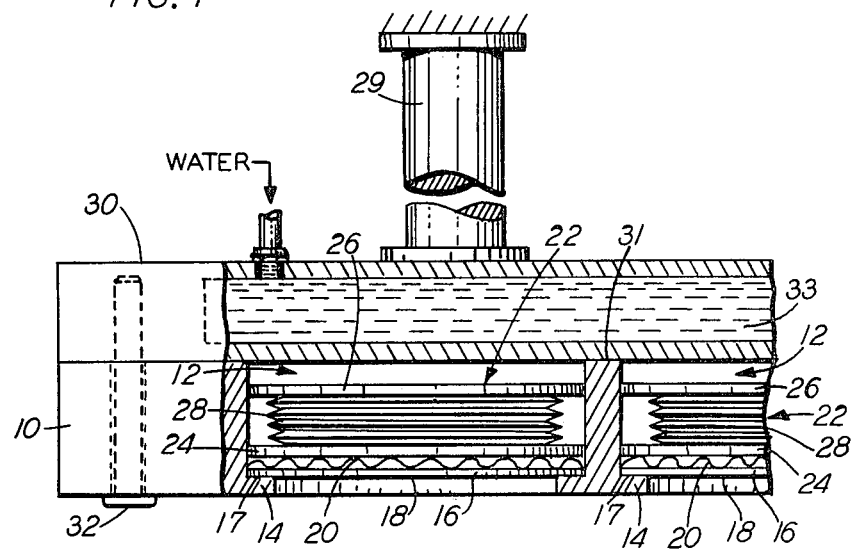
FIG 1 is a breakaway pictorial of a partial view of a holding fixture and a cooling plate with wafers and expandable heat pipes in place.

It will be appreciated that for simplicity and clarity of explanation the figures have not necessarily been drawn to scale. Further, as considered appropriate, reference numerals have been repeated in the figures to indicate corresponding features.

DETAILED DESCRIPTION

Referring now to FIG. 1, a substrate platen or holding plate 10, shown in the preferred embodiment, is a thick metal disc having a plurality of counterbored holes 12 disposed therein. The counterbored holes 12 form a plurality of recessed areas or cavities for holding workpieces 16, for example magnetic bubble memories, and expandable heat pipes 22. Retaining ledges or lips 14 disposed around the bottom circumference of each of the cavities 12 form supporting rings for holding the outside circumference of the workpieces 16. The counterbored height of each hole extends from the top surface 17 of the ledges 14 to the top surface 31 of the holding plate 10.

The workpieces of the preferred embodiment are magnetic bubble memory wafers. Each wafer typically is a layered structure formed on a gadolinium gallium garnet substrate with layers of silicon dioxide, an aluminum-copper alloy conductor pattern, another silicon dioxide layer, a permalloy layer which is sputter etched as described below to form the magnetic bubble storage pattern, and a third silicon dioxide layer for passivation. The wafers 16 are placed in the holding plate 10 with their working sides 18 down and toward an ion source (not shown) in the bottom of an RF sputtering chamber (also not shown). The RF sputtering chamber can be any of numerous commercially available types, such as MRC model 8612, manufactured by Materials Research Corporation, Orangeburg, N.Y. After the wafer 16 is in place, a crinkled piece of aluminum foil 20 is placed on top of the wafer to provide uniform heat distribution across the back of the wafer by compensating for any lack of flatness of the two adjacent surfaces.

Heat pipes 22 are placed on top of the crinkled aluminum. At atmospheric pressure each heat pipe 22 is of a size sufficient to only partially fill the gap to the top of holding plate 10 in the counterbored holes 12. The top of the holding fixture 10 is placed against a water cooling plate, or cold plate 30, which is supported by a plurality of columns 29, only one of which is shown in FIG. 1. The cooling plate 30 is filled with a labyrinth of channels for circulating cooling water 33 through the plate to thereby maintain the plate at a constant and uniform temperature. Finally, a plurality of securing bolts 32, only one being evident in FIG. 1, are used to hold the holding plate and the cooling plate tightly together. When this structure is in place, and after a vacuum is drawn in the chamber, power is applied to the sputtering chamber to sputter etch the wafers 16, i.e., to bombard the working side 18 of the wafers 16 with ions to remove permalloy material not covered by photoresist.

Each heat pipe 22 includes a lower plate 24 and an upper plate 26 connected together by a bellows 28, which is expandable. A hermetic chamber is formed inside the bellows 28 between the two plates 24 and 26. Inside this chamber a suitable vaporizable liquid, in the preferred embodiment, water, has been introduced prior to sealing of the chamber. Also, during fabrication of the heat pipe, before the chamber is sealed, a vacuum is drawn inside the chamber so that under ambient conditions air pressure forces the two plates 24 and 26 to compress the bellows material 28. The holding plate and cooling plate are preferably made of stainless steel, the expandable heat pipe 22 is, for example, made with end plates 24 and 26 fabricated from copper, and the bellows material 28 fabricated from nickel.

The expandable heat pipe 22 is manufactured with dimensions such that under atmospheric pressure the combination of the heat pipe and the crinkled aluminum foil 20 and the wafer lying on the ledges 14 is at a slightly lower height than the height of the counterbored portion of the hole of the holding fixture 10. Thus, when the holding plate 10 within the wafer 16, aluminum foil 20 and heat pipe 22 is introduced into a sputter etching chamber for attachment to the cooling plate 30, the top plates 26 of the heat pipe 22 do not extend above the top of the holding plate 10 so that the heat pipes do not interfere with the positioning of the holding plate 10 against the cooling plate 30.

Figure 2:
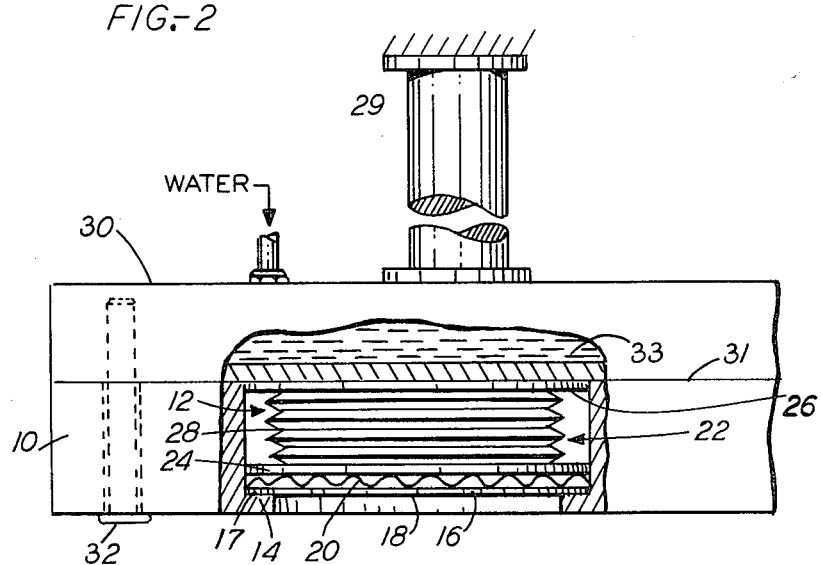
FIG. 2 is a breakaway pictorial similar to FIG. 1 with the expandable heat pipe expanded, as in a vacuum.

With the holding plate 10 firmly attached to the cooling plate 30 inside a sputter etching chamber, the chamber is evacuated, which relieves the atmospheric pressure on the expandable heat pipes 22 thereby allowing the spring tension on the bellows 28 to expand the plates 24 and 26 as shown in FIG. 2. This forces the expandable heat pipe to totally span the gap from the aluminum foil up to the cooling plate 30 and, in turn, to press the wafer 16 tightly against the retaining ledges 14. Thus, there is now a good thermal path from the wafer 16, through the aluminum foil 20, into the bottom plate 24 of the heat pipe 22, through the heat pipe 22, and from the top plate 26 into the cooling plate 30.

When the sputter etch chamber is turned on and RF power is applied, ions impinging on the working surface 18 of wafer 16 create heat inside the wafer. Such heat, in turn, is transferred through the crinkled aluminum foil 20 to the lower plate 24 of the expandable heat pipe 22. This heat on the lower plate 24 causes a vaporized fluid to boil and vaporize. The vapors rise inside the heat pipe 22 and condense on the upper plate 26. This vaporization and condensation transfers the heat from the lower plate 24 of the heat pipe to the upper plate 26. The heat is then transferred from the upper plate into the cold plate 30. Thus there is formed a good thermal conduction path from the wafer 16 to the cooling plate 30 to remove heat from the wafer generated during the sputtering etch process.

As an alternate embodiment to the heat pipe shown in FIG. 2, it is also possible to manufacture the heat pipe such that the vertical dimension of the heat pipe under a vacuum condition does not press tightly against the cool plate 30, but instead a narrow gap is left between the upper plate 26 of the heat pipe 22 and the cold plate 30. FIG. 1 serves to illustrate this alternate embodiment when it is understood that FIG. 1 shows the first embodiment under ambient air pressure conditions, and may also be taken to show this alternate embodiment under vacuum conditions. This alternate embodiment operates to serve as a temperature regulator for the wafer 16, as described below, to allow the temperature of the wafer to rise from ambient temperature to a predetermined higher temperature and then to stay at that temperature for the duration of the manufacturing process. The structure for this embodiment is the same as the first embodiment, except that the vertical height of the expandable heat pipe 22 under vacuum conditions is slightly less than that necessary to fill the gap between the crinkled aluminum foil 20 and the cold plate 30.

In the operation of this alternate embodiment, the wafer 16 is heated, and this heat is, in turn, passed through the crinkled foil 20 into the bottom plate 24 of the expandable heat pipe 22. At this time the coolant inside the heat pipe 22 boils and vaporizes and the vapors rise inside the heat pipe to the top plate 26. However, since there is only a moderate, i.e., not a good, thermal contact between the top plate 26 and the cold plate 30, the vapors heat up the top plate 26 but generally do not condense. As more of the fluid boils and more vapors are produced, the internal pressure inside the cavity of the heat pipe 22 increases to overcome the spring tension of the bellows 28, and the top plate 26 is forced against the cold plate 30 to provide a better thermal contact between the top plate 26 and the cold plate 30. As a result, the heat from the vapors is absorbed from the top plate 26 into the cold plate 30 and the vapors condense to reform into a liquid. At this point temperature regulation of the wafer 16 occurs.

The temperature of the wafer 16 is a balance of the heat generated inside the wafer during the sputtering etch process and the amount of heat being removed from the wafer through the heat pipe and into the cold plate 30. Stated another way, when the temperature of the wafer 16 is below a predetermined temperature, the gap between the top plate 26 of the heat pipe 22 and the cold plate 30 produces poor thermal conduction or heat transfer from the wafer 16 to the cold plate 30. Thus the heat being removed from the wafer 16 is less than the heat being generated inside the wafer and the vapor pressure inside the heat pipe 22 continues to increase, pushing the top plate 26 closer to the cold plate 30. At some point the top plate 26 is sufficiently close to the cold plate 30 to produce the proper thermal conductance between the wafer 16 and the cold plate 30 such that the heat generated inside the wafer is essentially balanced by the heat being transferred from the wafer 16 into the cold plate 30. At this point the system is in equilibrium and the temperature of the wafer 16 will remain stable.

If, for some reason, the heat being transferred from the wafer 16 into the cold plate 30 is greater than that being generated in the wafer 16, the vapor pressure inside the heat pipe 22 will drop, causing the top plate 26 of the heat pipe to move away from the cold plate 30. Thus the system operates to hold the temperature of the wafer 16 constant. This process would be advantageous, for example, during platinum sputtering and sintering operations on silicon wafers, and during evaporation of permalloy onto the magnetic bubble wafers, since both of these processes require elevated temperatures and are very temperature sensitive.

Although the invention has been described in part by making detailed reference to certain specific embodiments, such detail is intended to be and will be understood to be instructive rather than restrictive. It will be appreciated by those in the art that many variations may be made in the structures and modes of operation without departing from the spirit and scope of the invention, as disclosed in the teachings contained herein.

For example, the holding fixture 10 could be fabricated from two drilled discs, a first relatively thin lower disc, having a plurality of holes drilling therein, and a relatively thick upper disc having the same plurality of similarly positioned holes drilled therein, but larger than the holes drilled in the lower disc and spaced such that when the two discs are placed together the lower ledge 14, as shown in FIG. 1, is formed by the thinner disc, and the counterbored portion of the hole is formed by the thicker disc.

Also, the cooling liquid which is vaporizable inside the heat pipes 22 may be any of a number of different types of material depending on the temperature range of operation of the heat pipe, as will be understood by those skilled in the art.

Further, the heat pipe 22 may contain wicks to enable operation of the heat pipe in configurations in which the cold plate is not vertically on top of the wafer to be cooled, thus making the operation independent of the gravity vector.

Although the crinkled aluminum foil 20 is used in the preferred embodiment, this aluminum foil may, of course, be eliminated by establishing proper flatness tolerances on the bottom plate of the heat pipe 22.

And finally, while the preferred embodiment refers to sputter etching of magnetic bubble wafers it will be understood by those skilled in the art that the principles of this invention are applicable also to a great variety of other types of workpieces such as wafers having silicon substrates and to a great variety of processes occurring in a vacuum atmosphere, such as ion milling operations.

What is claimed is:

1. In a sputter etch process performed on a workpiece in an RF sputtering chamber wherein a highly conductive thermal path is provided between the workpiece and a cold plate and the workpiece is held securely in place during the sputtering operation, the improvement comprising using an expandable heat pipe for providing a highly conductive thermal path from the workpiece to a cold plate.

2. The improvement as set forth in claim 1, wherein said expandable heat pipe is used for holding the workpiece securely in place during the sputtering operation.

3. The improvement as set forth in claims 1 or 2, wherein said expandable heat pipe comprises a top plate and a bottom plate connected by a bellows to form a hermetic expandable cavity; and a vaporizable liquid inside said cavity.

4. A method for sputter etching a workpiece in a vacuum comprising the steps of:
 (a) exposing a photoresist pattern onto the working surface of a workpiece and removing the photoresist in the areas of the workpiece to be etched;
 (b) placing the workpiece in a holding plate inside an RF sputtering chamber;
 (c) placing a compressed heat pipe in intimate thermal contact with the wafer;
 (d) drawing a vacuum in said chamber to permit the heat pipe to expand and form a low thermal impedance path from the wafer to a cooling plate inside said chamber; and
 (e) applying power to said RF sputtering chamber for bombarding the wafer with ions for removing materials from the working surface of the wafer not covered by the photoresist.

5. A method for sputter etching a workpiece as set forth in claim 4 wherein said workpiece is a wafer.

* * * * *